United States Patent [19]

Bobbio et al.

[11] Patent Number: 4,615,764

[45] Date of Patent: Oct. 7, 1986

[54] SF6/NITRIDING GAS/OXIDIZER PLASMA ETCH SYSTEM

[75] Inventors: Stephen M. Bobbio, Winterville, Ga.; Marie C. Flanigan, Lockport, N.Y.; Kenneth M. Thrun, Buffalo, N.Y.; Ralph L. DePrenda, Amherst, N.Y.

[73] Assignee: Allied Corporation, Morris Township, Morris County, N.J.

[21] Appl. No.: 668,052

[22] Filed: Nov. 5, 1984

[51] Int. Cl.$^4$ .................... B44C 1/22; C03C 15/00; C03C 25/06; H01L 21/306

[52] U.S. Cl. .................... 156/643; 156/646; 156/653; 156/657; 156/659.1; 156/662; 204/192.37; 252/79.1

[58] Field of Search .............. 156/643, 646, 653, 657, 156/659.1, 662; 204/164, 192 EC, 192 E; 252/79.1; 427/38, 39

[56] References Cited

U.S. PATENT DOCUMENTS

| | | | |
|---|---|---|---|
| 3,679,502 | 7/1972 | Hays | 156/17 |
| 3,923,568 | 12/1975 | Bersin | 156/8 |
| 3,940,506 | 2/1976 | Heinecke | 427/38 |
| 3,971,684 | 7/1976 | Muto | 156/13 |
| 4,052,251 | 10/1977 | Weitzel | 156/612 |
| 4,213,818 | 7/1980 | Lemons et al. | 252/79.1 X |
| 4,214,946 | 7/1980 | Forget et al. | 156/643 |
| 4,283,249 | 8/1981 | Ephrath | 156/643 |
| 4,310,380 | 1/1982 | Flamm et al. | 156/643 |
| 4,314,875 | 2/1982 | Flamm | 156/657 |
| 4,324,611 | 4/1982 | Vogel et al. | 156/643 |
| 4,330,384 | 5/1982 | Okudaira et al. | 156/643 |
| 4,381,967 | 5/1983 | Sanders et al. | 156/659 |
| 4,465,552 | 8/1984 | Bobbio et al. | 156/643 |

Primary Examiner—William A. Powell
Attorney, Agent, or Firm—Arthur J. Plantamura; Jay P. Friedenson; Richard C. Stewart, II

[57] ABSTRACT

A gaseous mixture of $SF_6$, a nitriding gas component and an oxidizer gas component is disclosed as an effective $SiO_2$ etchant having enhanced selectively for use in either the plasma or reactive ion etch process. By adding an oxidizing gas to the $SF_6$ nitriding gas plasma etchant, the selectively for $SiO_2$ over silicon or polysilicon is marked improved. The optional addition of an inert diluent gas did not substantially change these results.

11 Claims, 2 Drawing Figures

SF6/NITRIDING GAS/OXIDIZER PLASMA ETCH SYSTEM

BACKGROUND OF THE INVENTION

This invention relates to an $SF_6$/nitriding gas plasma etching or reactive ion etching system. More particularly, the invention relates to an improvement in an etchant system of the kind disclosed in U.S. Pat. application Ser. No. 522,437 filed Aug. 11, 1983, U.S. Pat. No. 4,465,552, relating to selectively etching silicon dioxide with an $SF_6$/nitriding component gas composition. The present invention affords improved selectivity in etching systems of this kind.

An important step in the manufacture of semiconductor chips and thin film circuitry is the etching of the different layers such as polysilicon and silicon dioxide which make up the finished semiconductor chip or the thin film circuit. In the manufacture of these thin film circuits, one method of etching has been to overlay the surface to be etched with a suitable mask and to immerse the circuit so masked in a chemical solution which attacks the surface to be etched while leaving the mask otherwise substantially intact. It has been difficult with the chemical etching processes presently known to achieve at all times well-defined edges on the etched surfaces. The difficulty arises because the chemical action tends to etch isotropically, i.e., the chemical etching undercuts the mask by the same distance that it penetrates the underlayer, and thus enlarges the feature. It is, therefore, very difficult to use wet chemical etching to achieve fine structures of good sharp quality; fine structures being defined as structures having geometries on the order of one micron.

One known method for manufacturing semiconductor chips is called "plasma etching" in which a vacuum container is filled with a low pressure gas such as a fluorocarbon or $SF_6$. A surface to be etched is covered by a mask and inserted into the container along with the reactive gas. To etch the surface, an ac voltage whose frequency may be between 20 kHz and 30 Ghz is applied to excite the fluorocarbon or $SF_6$, thereby dissociating the fluorocarbon or $SF_6$ and forming various positive and negative ions, reactive neutral species (e.g., F atoms), and electrons. The dissociated species interact with the surface to be etched producing various gases as reaction products.

The ability to etch thin (approximately 1 $\mu$) layers of $SiO_2$ over Si is an important aspect of the plasma or reactive ion etch processes used in microcircuit manufacture. The plasma field of any given apparatus or oxide layer thickness is not necessarily uniform over the entire wafer surface, thus the etch may penetrate the $SiO_2$ layer at different times. In order to avoid etching the underlying silicon underlayer where the oxide has first cleared, it is desirable to arrange a selective plasma process which does not seriously affect or diminish the etch rate on $SiO_2$ but significantly decreases the rate on silicon.

We have found in working with the $SF_6$/nitriding plasma composition of the above noted U.S. Pat. application Ser. No. 522,437, particularly when using a low frequency excitation source, that selectivity can be significantly improved when the $SF_6$/nitriding plasma is modified with an oxidizing component. The improvement afforded by using the combination including an oxidizing component substantially enhances the practical processing of the work pieces to be etched.

SUMMARY OF THE INVENTION

In accordance with the invention, we have found that when a suitable oxidizing component(s), preferably one or a combination selected from the group consisting of $CO_2$, $O_2$, NO, $SO_2$ and $H_2O$ (vapor), is added to a gaseous mixture of $SF_6$ and a nitrogen containing compound that is effective in nitriding the silicon surface as, disclosed in U.S. Pat. application Ser. No. 522,437, a more selective $SiO_2$ etchant for use in either the plasma or reactive ion etch processes is provided. For example, a plasma comprising $SF_6$ alone is very selective for etching silicon over $SiO_2$. The addition of a nitriding gas reverses this selectivity such that $SiO_2$ is etched at a faster rate than silicon or polysilicon. However, when an $SF_6/NH_3$ gas system is used in conjunction with a 35 khz plasma excitation source and with a large electrode separation, it is difficult to obtain $SiO_2$/Si selectivities in excess of 1.8. With the addition of an oxidizing species as described in accordance with this invention, we have discovered that the selectivity of the $SF_6/NH_3$ system under these same conditions can be significantly improved.

Oxidizing compounds which may be incorporated and which furnish the oxidizing gas component for the plasma gas in accordance with the invention include NO, $CO_2$, $H_2O$, $O_2$ and $SO_2$. In addition, various nitrogen compounds may be substituted for the $NH_3$ in the gas mixture (as in U.S. Pat. application No. 522,437) to provide the nitriding effect on the silicon surface. The $SF_6$/nitriding gas/oxidizing component mixture may also contain an inert diluent gas such as argon, helium, neon, krypton or xenon, etc.

Any deposition which is formed during the course of the etching operation is readily obviated by heating the environment contiguous to the plasma etching apparatus.

DESCRIPTION OF THE PREFERRED EMBODIMENTS

In accordance with the invention an improved composition is provided for etching thin film circuits or semiconductor chips which is capable of producing improved selectivity and well defined edges on etched materials while at the same time achieving rapid etching rates. The method permits the preferential etching of silicon dioxide over silicon (or over polysilicon) in articles containing a layer of silicon dioxide on an underlayer of silicon (or polysilicon) in the manufacturing process. Specifically, the selective etching is effected by exposing the article to a plasma gas discharge wherein the plasma composition comprises $SF_6$ in combination with a nitriding component and an oxidizing component in the gaseous phase. It has been found that the addition of an oxidizing component to the $SF_6$/nitriding gas plasma composition notably enhances the selectivity in the etch rate of the silicon dioxide over the silicon or polysilicon.

In conducting the etching process in accordance with the invention, the $SF_6/NH_3/$ oxidizer composition is placed in a container along with the exciting electrode and a grounded electrode. The silicon dioxide surface to be etched is covered by a suitable mask and the substrate mounted on one of the electrodes, e.g., on the powered electrode, which may become negatively biased relative to ground once the plasma is established (reactive ion mode) or on the grounded electrode in the plasma mode. The electric field established in the region between the electrodes accelerates free electrons which then serve to dissociate the gas forming the $SF_6$/nitriding oxidizing plasma which is positive relative to its surroundings. The silicon dioxide surface is etched by both chemical interaction with various active species and by energy and momentum transfer of positive ions impinging on the surface. The ions impinging on the silicon dioxide surface arrive predominantly in a direction perpendicular to that surface so that the process produces well defined vertically etched sidewalls. The use of a nitriding component, such as ammonia, and the $SF_6$/oxidizer gas allows the silicon dioxide to be selectively and anisotropically etched against a silicon or polysilicon underlayer.

Figure 1:
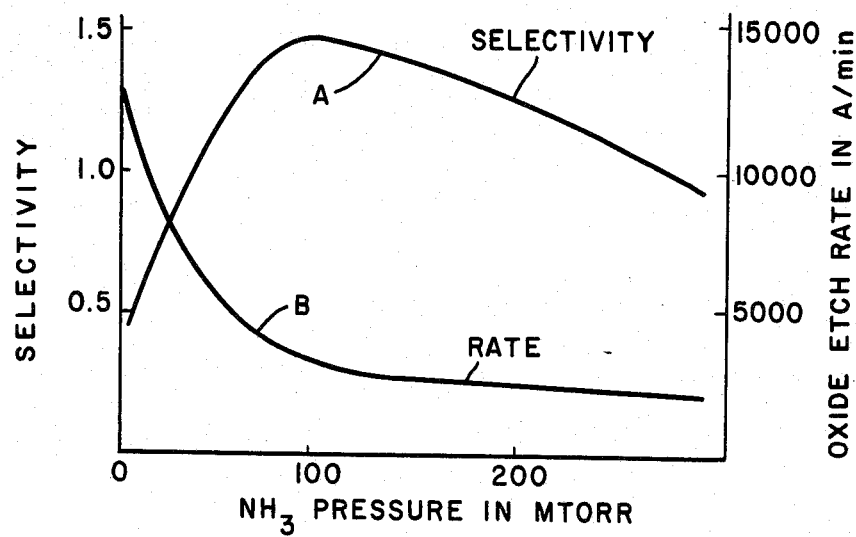
FIG. 1 are typical comparative curves illustrating the effect of addition of $NH_3$ to an $SF_6$ plasma on $SiO_2$/Si selectivity and on oxide etch rates at 35 khz.

We have discovered in accordance with the invention, that a substantial modification occurs in the $SF_6/NH_3$ system when an oxidizing species such as NO, $SO_2$, $H_2O$, $O_2$ or $CO_2$ is added to the $SF_6/NH_3$ mixtures. Under controlled conditions this leads to a significant improvement in selectivity for oxide etch. For example, when the $SF_6/NH_3$ gas system is used in conjunction with a 35 khz plasma, excitation source and large electrode separation, it is difficult to obtain $SiO_2/Si$ selectivities in excess of 1.8. As $NH_3$ is added to the $SF_6$ plasma selectivity increased up to a point but beyond this the oxide etch rate dropped significantly so as to actually worsen the situation. This is illustrated by reference to FIG. 1, Curve A, wherein it is seen that the selectivity (defined by etch rate of $SiO_2$ divided by the etch rate of Si) reached a maximum of 1.5 in the case shown. Further addition of $NH_3$ produced a continuing decrease in the $SiO_2$ etch rate. This is illustrated by curve B. The decrease in $SiO_2$ etch rate is subsequently reflected by the decrease in selectivity shown by the right hand end of Curve A.

Figure 2:
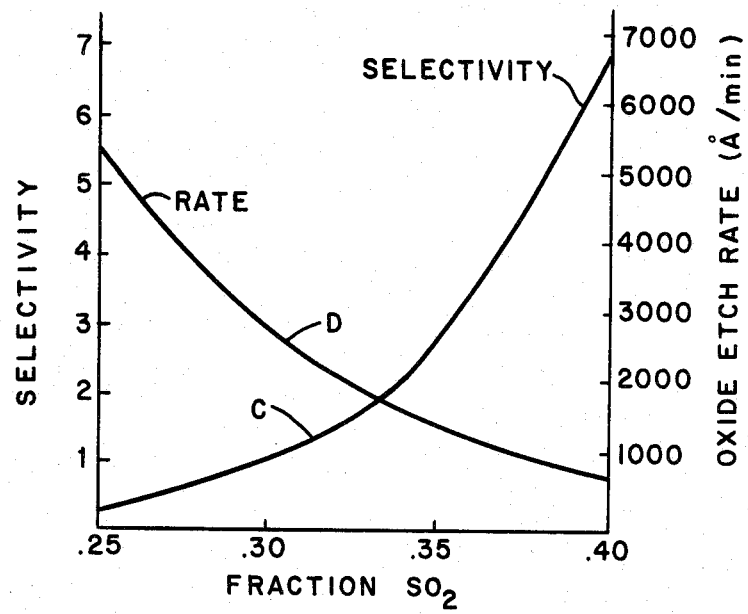
FIG. 2 illustrates the increase in $SiO_2$/Si selectivity in the $SF_6/NH_3$ system at 35 khz when an oxidizing gas component (in this case $SO_2$) is added to the mixture at a total pressure of 400 mtorr with the partial pressures of $NH_3$ and $SO_2$ being equal and $SF_6$ making up the remainder.

By the addition of an oxidizing species to the $SF_6$/nitriding gas plasma etch system, the selectivity of the $SF_6/NH_3$ system is markedly improved. In some cases, the phenomenon introduced by addition of the oxidizing gas component appears to involve a fast oxidation of the nitrided silicon surface with a concurrent slower etch of the resulting oxide. Discounting any contribution from the nitride, this leads to a theoretical maximum $SiO_2/Si$ selectivity of approximately 2.2, where this number represents the ratio of the silicon atom densities (density Si/density $SiO_2$). This theoretical model is not supported in all cases, however. For example, the increase in the $SiO_2/Si$ selectivity of the $SF_6/NH_3$ system as $SO_2$ is added is illustrated in FIG. 2. Each of the experiments was conducted at a total pressure of 500 mtorr with the partial pressures of $NH_3$ and $SO_2$ being equal and $SF_6$ making up the remainder. For the larger $SO_2$ fractions in FIG. 2 the selectivity enhancement substantially exceeds the simple oxidization/etch model one would typically expect.

For a practical etch system the erosion rate of the photoresist should be as low as possible. Generally the ratio of partial pressures of the gaseous components, i.e., of $SF_6$ to nitriding gas e.g. $NH_3$ is on the order of about 17:3 to about 1:4. The proportion of $SF_6$ to oxidizing component in the gaseous plasma is of the order of about 1:25 to about 3:1 and preferably about 1:15 to about 2:1. The actual ratio will depend on a number of prevailing parameters (e.g. the particular oxidizer used, reactor geometry, level of excitation, electrode spacing, etc.).

The oxidizing component that furnishes the oxidizing gas may take any suitable form providing that at the time of the etch process it is available in the plasma as an oxidizing gas. Thus the hereinabove disclosed compounds used as oxidizing gas source may be introduced initially in the form of solids or liquids as well as in the gaseous form per se.

Any deposition of decomposition products tending to occur during the course of the etching process, as is often encountered with fluorocarbon processes, should be avoided and may be eliminated by heating the reaction chamber, such as by wrapping a heating jacket or thermal tape around the plasma reactor. A minimum temperature of about 50° C. may be used. (This minimum temperature will vary somewhat depending on actual gas composition and power level used and other prevailing conditions.) The maximum temperature is limited by the photoresist mask and a temperature of 125° C. or below is usually necessary to avoid photoresist degradation.

While the invention has been particularly shown and described with reference to the preferred embodiments thereof, it will be understood by those skilled in the art that various changes in form and detail may be made therein without departing from the spirit and scope of the invention.

What is claimed is:

1. Method of enhancing the selectivity in etching silicon dioxide preferentially over silicon or polysilicon in an article containing a layer of silicon dioxide on an underlayer of silicon or polysilicon in which said article is exposed to a low pressure plasma gas mixture discharge and wherein the plasma comprises $SF_6$ and a nitriding component in the gaseous phase, the improvement comprising adding an oxidizer as a component of the plasma gas mixture and continuing said exposure of said article until the silicon dioxide layer is penetrated.

2. The method of claim 1 wherein the oxidizing component is carbon dioxide.

3. The method of claim 1 wherein the oxidizer is sulfur dioxide.

4. The method of claim 1 wherein the oxidizer is nitric oxide.

5. The method of claim 1 wherein the oxidizer is oxygen.

6. The method of claim 1 wherein the oxidizer is $H_2O$ vapor.

7. The method of claim 1 in which the gas mixture is diluted with an inert gas.

8. The method of claim 1 wherein the plasma gas mixture incorporates in a proportion by partial pressures of the $SF_6$ component to the oxidizer of from about 1:25 to about 3:1.

9. The method of claim 8 wherein the nitriding component is ammonia and the oxidizer is carbon dioxide and the proportion by partial pressure of $SF_6$ to oxidizing gas is about 1:15 to about 2:1.

10. A plasma etch gas for selectively etching silicon dioxide against silicon comprising a mixture of $SF_6$, a nitriding gas and an oxidizing gas in partial pressure ratio of $SF_6$ to nitriding gas of from about 17:3 to about 1:4 and for $SF_6$ to oxidizing gas of from about 1:25 to about 3:1.

11. A plasma etch gas according to claim 10 containing the oxidizing gas in a proportion to $SF_6$ by partial pressure of 1:15 to about 2:1.

* * * * *